(12) United States Patent
Solal et al.

(10) Patent No.: US 11,177,791 B2
(45) Date of Patent: Nov. 16, 2021

(54) HIGH QUALITY FACTOR TRANSDUCERS FOR SURFACE ACOUSTIC WAVE DEVICES

(71) Applicant: Qorvo US, Inc., Greensboro, NC (US)

(72) Inventors: Marc Solal, Longwood, FL (US); Shogo Inoue, Longwood, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/265,511

(22) Filed: Feb. 1, 2019

(65) Prior Publication Data
US 2020/0252045 A1    Aug. 6, 2020

(51) Int. Cl.
| H03H 9/02 | (2006.01) |
| H03H 9/64 | (2006.01) |
| H03H 9/145 | (2006.01) |
| H03H 9/25 | (2006.01) |

(52) U.S. Cl.
CPC ...... *H03H 9/1457* (2013.01); *H03H 9/02559* (2013.01); *H03H 9/25* (2013.01); *H03H 9/6483* (2013.01); *H03H 9/6489* (2013.01)

(58) Field of Classification Search
CPC ........ H03H 9/145; H03H 9/1457; H03H 9/25; H03H 9/6489; H03H 9/02
USPC .......................................................... 333/195
See application file for complete search history.

(56) References Cited

U.S. PATENT DOCUMENTS

| 7,453,334 | B1 * | 11/2008 | Abbott | ............... | H03H 9/02543 |
| | | | | | 310/313 B |
| 7,576,471 | B1 | 8/2009 | Solal | | |
| 7,939,989 | B2 * | 5/2011 | Solal | ................. | H03H 9/02858 |
| | | | | | 310/313 B |
| 8,294,331 | B2 * | 10/2012 | Abbott | ............... | H03H 9/02858 |
| | | | | | 29/25.35 |
| 9,673,779 | B2 * | 6/2017 | Ruile | ....................... | H03H 3/08 |
| 9,712,139 | B2 * | 7/2017 | Taniguchi | .......... | H03H 9/02992 |
| 2011/0006855 | A1 | 1/2011 | Fujiwara et al. | | |
| 2012/0161577 | A1 | 6/2012 | Abbott et al. | | |
| 2019/0068159 | A1 * | 2/2019 | McHugh | ............ | H03H 9/02834 |

OTHER PUBLICATIONS

M. Solal et al., Transverse modes suppression and loss reduction for buried electrodes SAW devices, 2010, IEEE, 5 pages.*
Abbott, Ben, et al., "Recent Advances in SAW Technology," International Symposium on Acoustic Wave Devices for Future Mobile Communication Systems, Dec. 2012, pp. 73-78.

(Continued)

*Primary Examiner* — Dean O Takaoka
(74) *Attorney, Agent, or Firm* — Withrow & Terranova, PLLC

(57) ABSTRACT

The present disclosure relates to acoustic wave devices, and particularly to high quality factor (Q) transducers for surface acoustic wave (SAW) devices. An exemplary SAW device includes an interdigital transducer (IDT) between two reflective gratings to form a resonator. The resonator operates through shear horizontal mode acoustic waves, and therefore suppression of transverse modes (parallel to electrode fingers of the IDT) is desired. A piston mode can be formed in the resonator to suppress transverse modes, which may also increase energy leakage and result in a lower Q. A higher Q is achieved by adding a fast region at an end of one or more of the electrode fingers of the IDT.

25 Claims, 16 Drawing Sheets

(56) References Cited

OTHER PUBLICATIONS

Abbott, Ben, et al., "Temperature Compensated SAW with High Quality Factor," International Ultrasonics Symposium, Sep. 2017, IEEE, 7 pages.

Abbott, Ben, et al., "Theoretical Investigation Into Spurios Modes Content in SAW Devices with a Dielectric Overcoat," 4th International Symposium on Acoustic Wave Devices for Future Mobile Communication Systems, Mar. 2010, IEEE, 17 pages.

Koskela, Julius, et al., "Suppression of the Leaky SAW Atenuatotion with Heavy Mechanical Loading," Transactions on Ultrasonics, Ferroelectrics, and Frequency Control, vol. 45, Issue 2, Mar. 1998, IEEE, pp. 439-449.

Plessky, Victor, et al., "Characteristics of Leaky SAWs on 36-LiTa03 in Periodic Structures of Heavy Electrodes," Ultrasonics Symposium, 1993, IEEE, pp. 1239-1242.

Solal, Marc, et al., "A method to reduce losses in buried electrodes RF SAW resonators," International Ultrasonics Symposium Proceedings, 2011, IEEE, pp. 324-332.

Solal, Marc, et al., "Design Modeling and Visualization of Low Transverse Modes R-SPUDT Devices," IEEE Ultrasonics Symposium, 2006, pp. 82-87.

Solal, Marc, et al., "Design, Simulation, and Visualization of SPUDT Devices With Transverse Mode Suppression," Transactions on Ultrasonics, Perroelectrics, and Frequency Control, vol. 57, Issue 2, Feb. 2010, IEEE, pp. 412-420.

Solal, Marc, et al., "Transverse modes suppression and loss reduction for buried electrodes SAW devices," International Ultrasonics Symposium Proceedings, 2010, IEEE, pp. 624-628.

Wang, Yiliu, et al., "A Zero TCF Band 13 SAW Duplexer," International Ultrasonics Symposium Proceedings, 2015, IEEE, 4 pages.

Yamanouch, Kazuhiko, "Coupling and zero TCF SH-SAW and SH-Boundary SAW Using Electrodes/Rotated Y-X LiTa03 and Si02/Electrodes/Rotated Y-X LiTa03," Joint UFFC, EFTF and PFM Symposium, 2013, IEEE, pp. 1061-1064.

\* cited by examiner

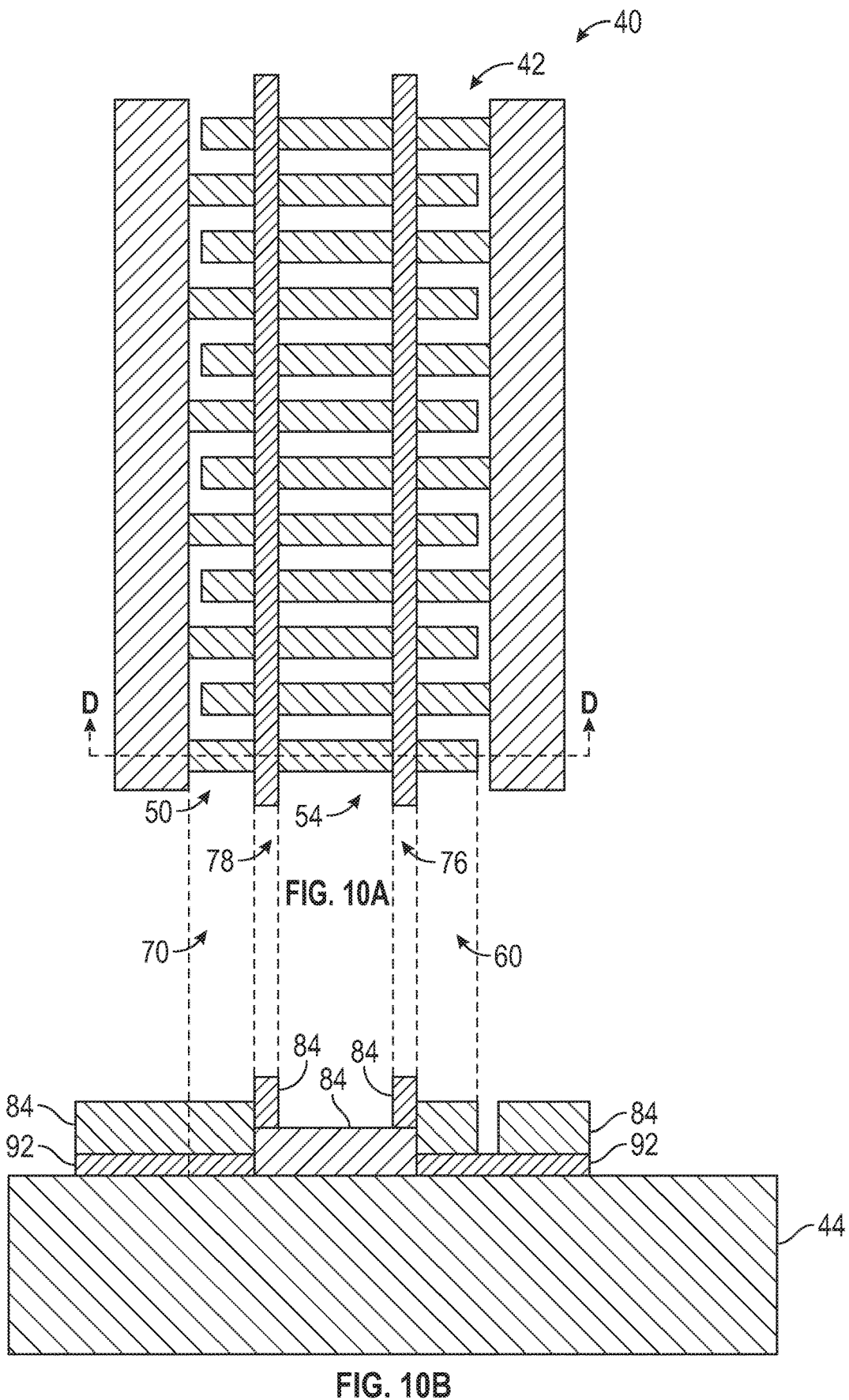

HIGH QUALITY FACTOR TRANSDUCERS FOR SURFACE ACOUSTIC WAVE DEVICES

FIELD OF THE DISCLOSURE

The present disclosure relates to acoustic wave devices, and particularly to high quality factor (Q) transducers for surface acoustic wave (SAW) devices.

BACKGROUND

Acoustic wave devices are widely used in modern electronics. At a high level, acoustic wave devices include a piezoelectric material in contact with one or more electrodes. Piezoelectric materials acquire a charge when compressed, twisted, or distorted, and similarly compress, twist, or distort when a charge is applied to them. Accordingly, when an alternating electrical signal is applied to the one or more electrodes in contact with the piezoelectric material, a corresponding mechanical signal (i.e., an oscillation or vibration) is transduced therein. Based on the characteristics of the one or more electrodes on the piezoelectric material, the properties of the piezoelectric material, and other factors such as the shape of the acoustic wave device and other structures provided on the device, the mechanical signal transduced in the piezoelectric material exhibits a frequency dependence on the alternating electrical signal. Acoustic wave devices leverage this frequency dependence to provide one or more functions.

Surface acoustic wave (SAW) devices, such as SAW resonators and SAW filters, are used in many applications such as radio frequency (RF) filters. For example, SAW filters are commonly used in second generation (2G), third generation (3G), fourth generation (4G), and fifth generation (5G) wireless receiver front ends, duplexers, and receive filters. The widespread use of SAW filters is due to, at least in part, the fact that SAW filters exhibit low insertion loss with good rejection, can achieve broad bandwidths, and are a small fraction of the size of traditional cavity and ceramic filters. As the use of SAW filters in modern RF communication systems increase, there is a need for SAW filters with improved quality factor (Q) and reduced energy leakage.

SUMMARY

The present disclosure relates to acoustic wave devices, and particularly to high quality factor (Q) transducers for surface acoustic wave (SAW) devices. An exemplary SAW device includes an interdigital transducer (IDT) between two reflective gratings to form a resonator. The resonator may operate through shear horizontal mode acoustic waves. The transducer may serve as a waveguide, and therefore suppression of transverse modes (parallel to electrode fingers of the IDT) is desired. A piston mode can be formed in the resonator to suppress transverse modes, which may also increase energy leakage and result in a lower Q. A higher Q is achieved by adding a fast region at an end of one or more of the electrode fingers of the IDT.

In one aspect, a SAW device comprises a piezoelectric substrate and an IDT disposed over the piezoelectric substrate. The IDT comprises a first electrode and a second electrode. The IDT also comprises a first set of electrode fingers coupled to the first electrode, each comprising a first inside region, a first end defining a first gap with the second electrode, and a first fast region at the first end defining a first propagation velocity on the piezoelectric substrate which is faster than the first inside region. The IDT also comprises a second set of electrode fingers interleaved with the first set of electrode fingers and coupled to the second electrode, each comprising a second inside region and a second end defining a second gap with the first electrode.

In another aspect, a SAW device comprises a piezoelectric substrate and an IDT disposed over the piezoelectric substrate. The IDT comprises a first electrode and a second electrode. The IDT also comprises a first set of electrode fingers coupled to the first electrode and having a first gap from the second electrode at a first end. The IDT also comprises a second set of electrode fingers interleaved with the first set of electrode fingers and coupled to the second electrode, having a second gap from the first electrode at a second end. The first end of the first set of electrode fingers and the second end of the second set of electrode fingers are physically modified to obtain a modified velocity compared to a center region between the first end and the second end such that a mode guided in the center region propagates.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 9A is a top view of another exemplary SAW device implementing the IDT of FIGS. 3A-6.

FIG. 10A is a top view of another exemplary SAW device implementing the IDT of FIGS. 3A-6.

FIG. 10B is a cross-section view taken along line D of FIG. 10A.

DETAILED DESCRIPTION

Figure 1A:
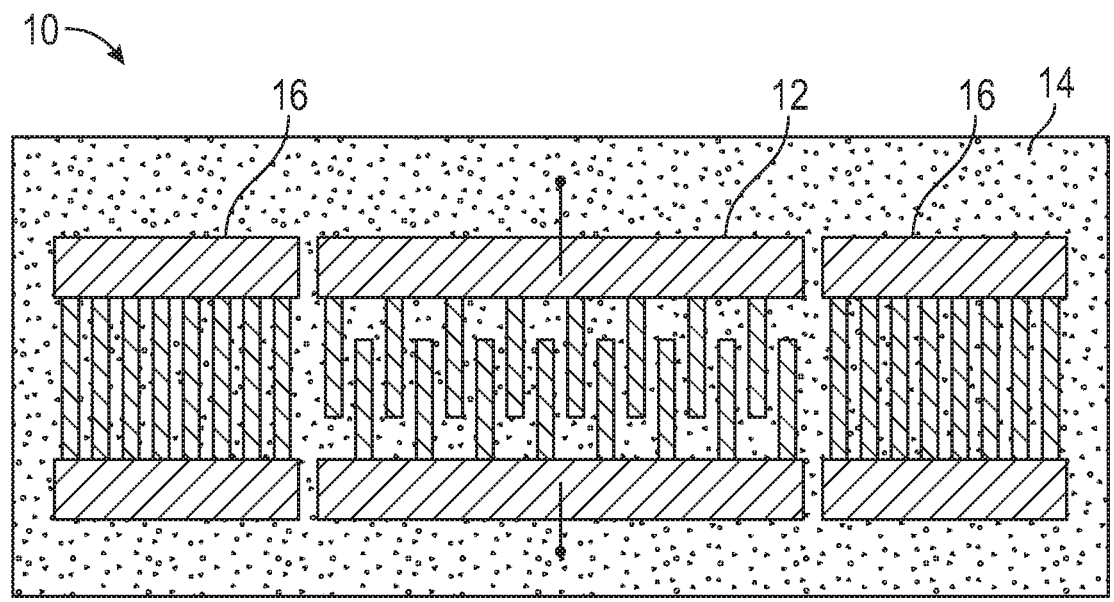
FIG. 1A is a schematic diagram of an exemplary surface acoustic wave (SAW) device, a SAW resonator.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to acoustic wave devices, and particularly to high quality factor (Q) transducers for surface acoustic wave (SAW) devices. An exemplary SAW device includes an interdigital transducer (IDT) between two reflective gratings to form a resonator. The resonator may operate through shear horizontal mode acoustic waves. The transducer may serve as a waveguide, and therefore suppression of transverse modes (parallel to electrode fingers of the IDT) is desired. A piston mode can be formed in the resonator to suppress transverse modes, which may also increase energy leakage and result in a lower Q. A higher Q is achieved by adding a fast region at an end of one or more of the electrode fingers of the IDT.

Figure 11:
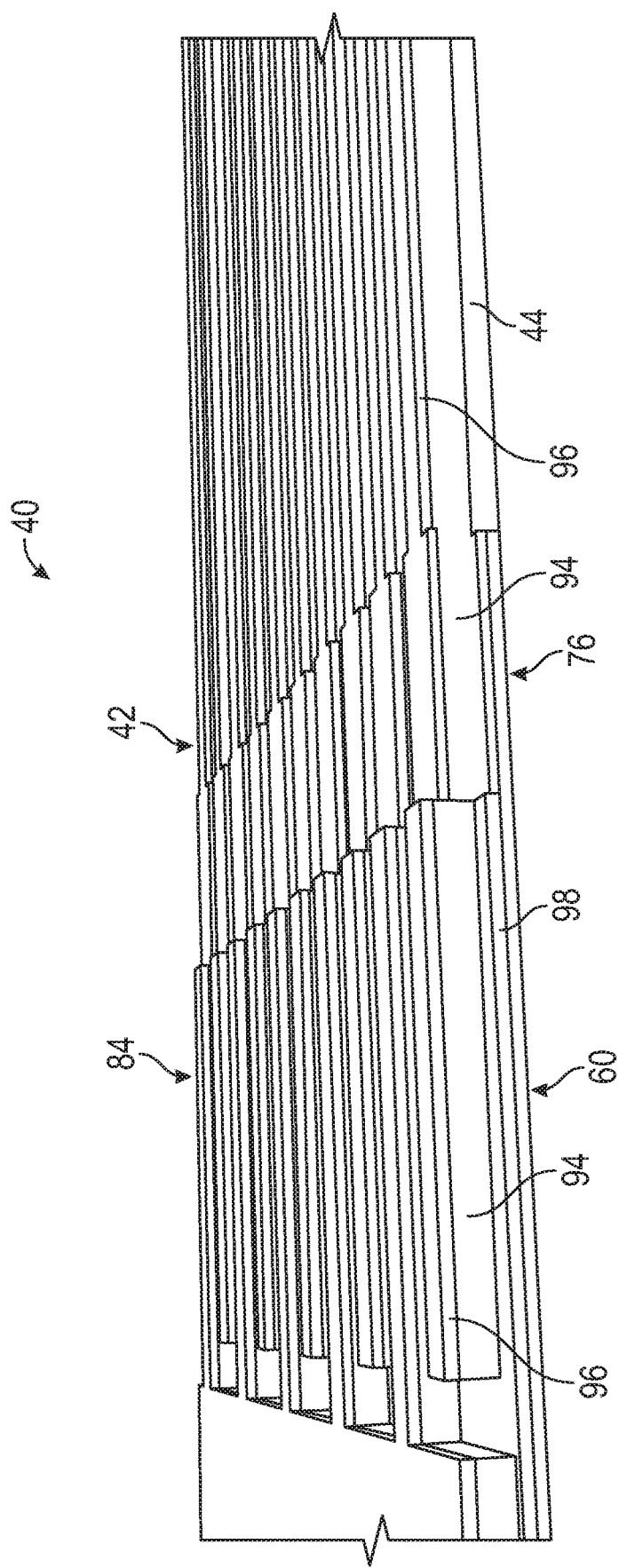
FIG. 11 is a perspective view of an exemplary SAW device according to aspects of the present disclosure.
Figure 12A:
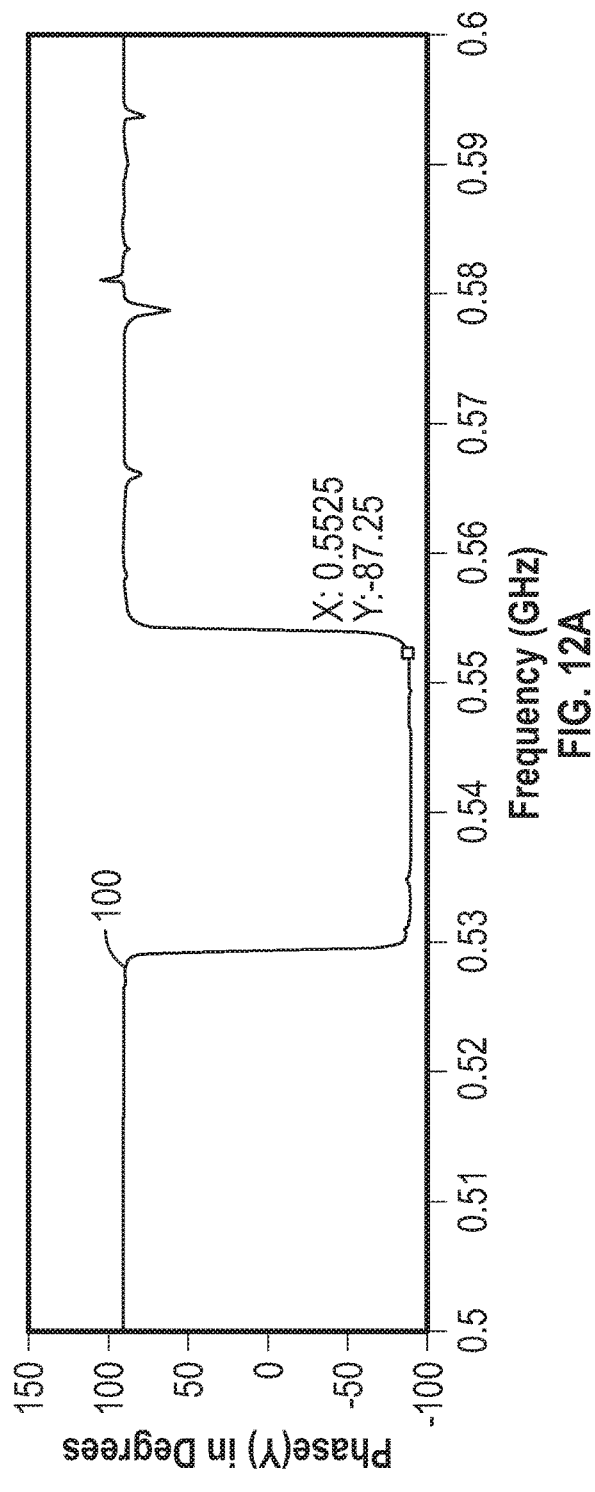
FIGS. 12A and 12B are graphical representations of the admittance phase and Q factor of the exemplary SAW device of FIG. 11.
Figure 12B:
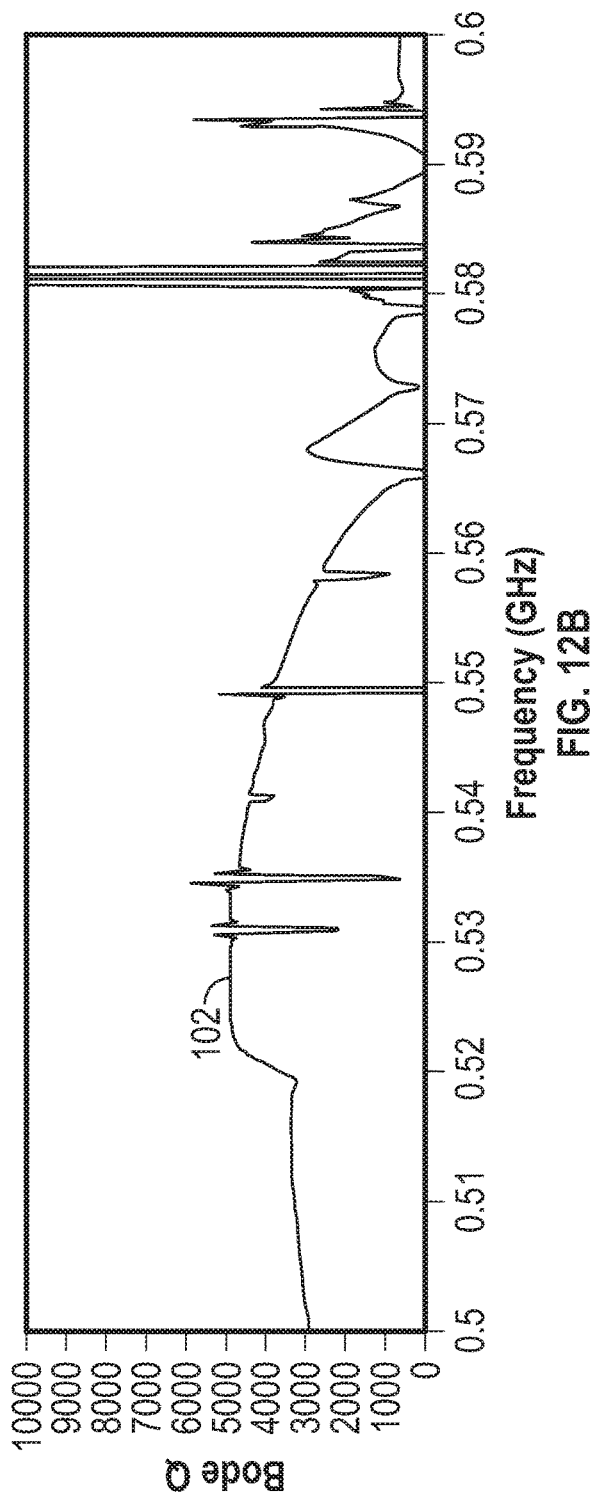

To assist in understanding aspects of the present disclosure, an overview of SAW devices is provided with reference to FIGS. 1A-2B. Exemplary SAW devices incorporating a modified IDT to improve Q factor are illustrated in FIGS. 3A-6. Top and cross-section views of exemplary SAW devices incorporating the modified IDT are illustrated in FIGS. 7A-10B. A perspective view of an exemplary SAW device according to aspects of the present disclosure is illustrated in FIG. 11. Performance of the exemplary SAW device of FIG. 11 is illustrated in FIGS. 12A and 12B.

FIG. 1A is a schematic diagram of an exemplary SAW device, a SAW resonator 10. The SAW resonator 10 includes a transducer 12 (which may be an IDT) to convert an electric signal to an acoustic wave propagating on a surface of a piezoelectric substrate 14. The transducer 12 is positioned between two reflective gratings 16 to form the SAW resonator 10. The SAW resonator 10 can be incorporated into a device such as a filter or duplexer by interconnecting several SAW resonators 10 (and/or other resonators) electrically and/or acoustically.

Figure 1B:
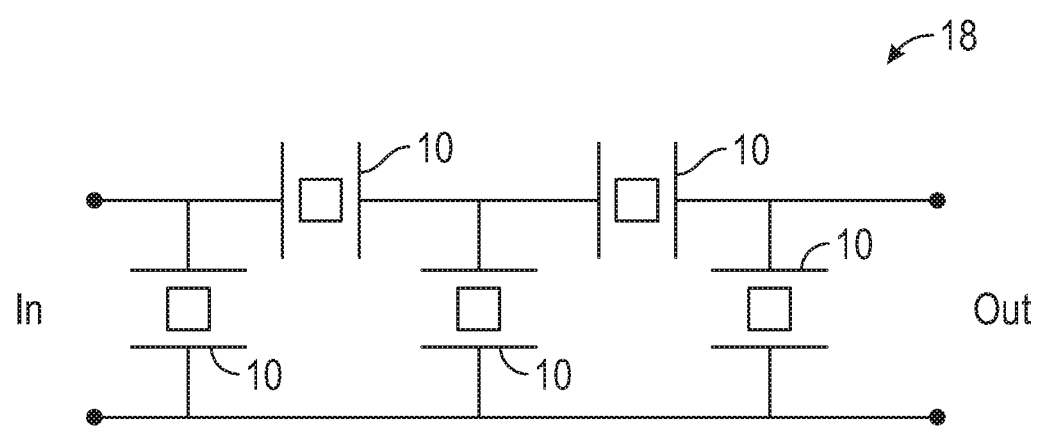
FIG. 1B is a schematic diagram of an exemplary ladder type filter including the SAW resonator of FIG. 1.

FIG. 1B is a schematic diagram of an exemplary ladder type filter 18 including the SAW resonator 10 of FIG. 1A. In this regard, several SAW resonators 10 are interconnected in an electrical network to form the exemplary ladder type filter 18. In other examples, the SAW resonators 10 can be arranged in other ways, such as a lattice configuration.

Figure 1C:
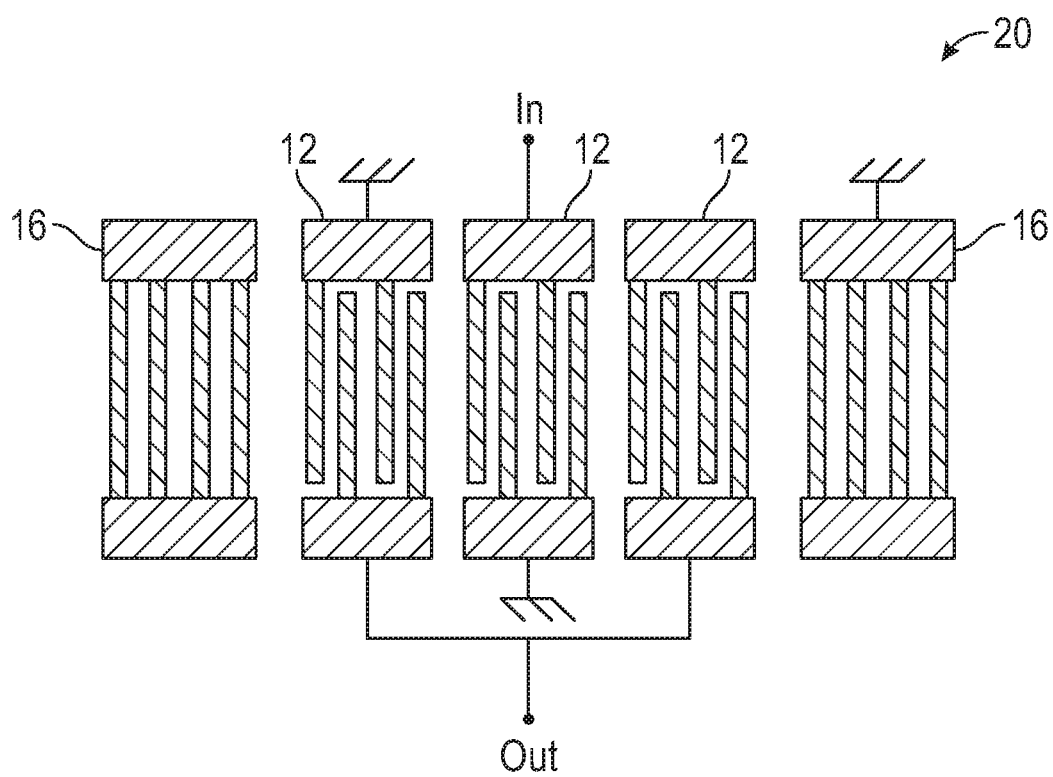
FIG. 1C is a schematic diagram of an exemplary coupled resonator filter (CRF) or double mode SAW (DMS) filter.

In still other examples, the SAW resonators 10 can be coupled acoustically, as depicted in FIG. 1C. FIG. 1C is a schematic diagram of an exemplary coupled resonator filter (CRF) 20 or double mode SAW (DMS) filter. In the CRF 20, several transducers 12 are positioned between the reflective gratings 16. One or several transducers 12 are connected in parallel between an input signal IN and a reference (e.g., ground), while another one or more transducers 12 are connected between the reference and an output signal OUT. The electrical signal at the input is transformed into an acoustical signal on the surface of the piezoelectric substrate 14. This acoustic wave propagates between input and output transducers 12 and is converted back into an electrical signal. Through selection of the number of transducers 12, their sizes, frequencies, apertures and other parameters, a band pass filter or other type of filter can be produced. In some examples, several CRF 20 stages are cascaded inside a filter to improve its performance. In some examples, some of the transducers 12 are not connected to a voltage and the reference voltage (ground) but are instead connected between two voltages which may be equal in amplitude and with 180 degrees phase difference (e.g., a differential or balanced drive). In some examples, the reflective gratings 16 may be absent or alternatively reflective gratings 16 may be inserted between the transducers 12.

A radio frequency (RF) filter may incorporate the SAW resonator 10 of FIG. 1A or the CRF 20 of FIG. 1C, in which one or more transducers 12 are disposed between the reflective gratings 16 over the piezoelectric substrate 14. Any appropriate material may be used for the piezoelectric substrate 14, such as lithium niobate or lithium tantalate. To improve the temperature coefficient of frequency (TCF) of a SAW resonator 10 or CRF 20, when lithium niobate (which has a negative TCF) is used electrodes of the transducers 12 can be embedded within a dielectric with a positive TCF (e.g., silicon oxide). However, because the TCF of a lithium tantalate piezoelectric substrate 14 is closer to 0, the electrodes may not be embedded in a dielectric. In addition, in cases where the electrodes are not embedded in the dielectric, one or more dielectric films may be deposited on top of the electrodes (e.g., to serve as passivation layers). In some cases, it may be further advantageous to add a dielectric layer between the electrodes and the piezoelectric substrate (e.g., to reduce the coupling factor).

The Q factor of the SAW resonator 10 or CRF 20 is linked to electrical and acoustical losses. The sources of acoustical losses are the viscous losses in the materials and the losses due to acoustic leakage. If the SAW resonator 10 or CRF 20 is not designed properly, a significant part of the acoustic energy can leak from the transducers 12. This leakage may be a bulk acoustic wave (BAW) leakage (meaning that the acoustic energy is leaking inside the piezoelectric substrate 14) or a transverse leakage (meaning that the acoustic energy is leaking on the surface outside of an active aperture of the transducers 12). Transverse leakage can happen on both niobate and tantalate substrates, while in usual situations BAW leakage happens mostly on lithium tantalate substrates.

To suppress the transverse leakage, the SAW resonator 10 or CRF 20 can be designed as a waveguide in the transverse direction. If a slowness curve of the surface acoustic wave in the transducer 12 has a convex shape, guiding is obtained when peripheral regions of the transducer 12 have a faster velocity than inside regions, resulting in an evanescent wave in the peripheral regions. If the slowness curve has a concave shape, guiding is obtained if the peripheral regions have a slower velocity than the inside regions. In most situations, the slowness curve in the transducer 12 has a convex shape, and embodiments of this disclosure are generally described with respect to this situation. On some substrates (e.g., lithium tantalate), the shape of the slowness curve is concave for the free surface, but it becomes convex in the transducer 12 due to the electrode presence when the metal thickness increases. To use this guiding effect, for example, each side of the active aperture can be provided with a region with a faster velocity, with the region being wide enough to avoid leakage. The fast region can be a gap at an end (e.g., periphery) of the interdigital electrodes. By using a gap larger than about one wavelength, the acoustic energy can be confined inside the acoustic aperture and improve the Q factor. However, acoustic waves are reflected at the edge of the transducers 12, giving rise to transverse modes. To suppress the transverse modes, it is possible to add a slow velocity region at the edge of the active region. This allows the propagation of a piston mode in the transducer 12. The piston mode has an amplitude which is essentially flat inside the aperture and which decreases in the slow edge region and in the fast gap. This mode amplitude is matched to the excitation shape with the result that almost no other mode is excited.

Figure 2A:
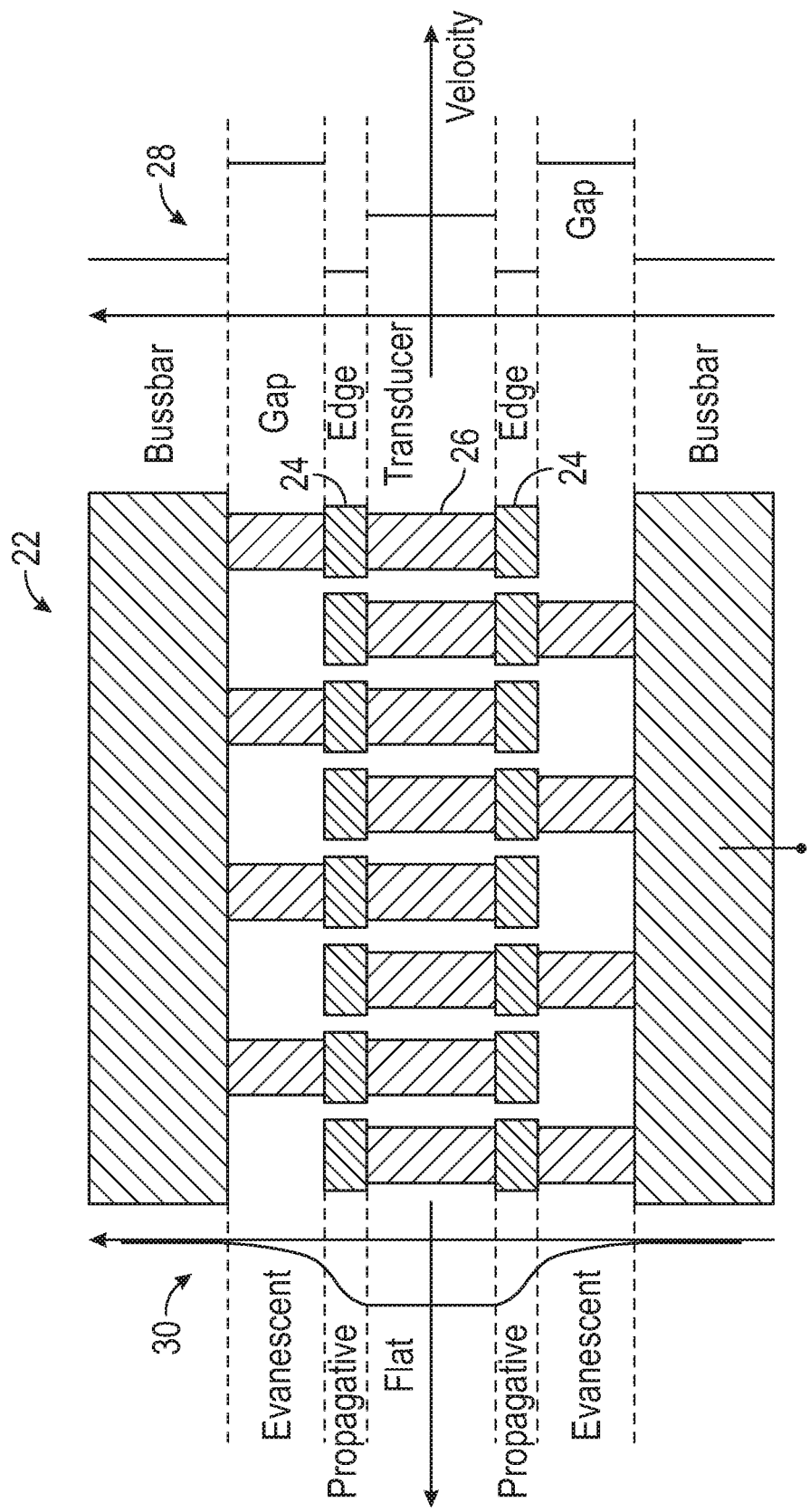
FIG. 2A is a schematic diagram of an exemplary piston mode transducer, which may be included in the SAW resonator of FIG. 1A or the CRF of FIG. 1C.

FIG. 2A is a schematic diagram of an exemplary piston mode transducer 22, which may be included in the SAW resonator 10 of FIG. 1A or the CRF 20 of FIG. 1C. In this regard, a slow velocity in an edge of the piston mode transducer 22 can be created by using a larger electrode width in an edge region 24 than in a center region 26 to obtain a slower velocity. In this regard, FIG. 2A includes a velocity diagram 28 indicating relative velocities of positions of the piston mode transducer 22. These velocities and an appropriate choice of the slow region width result in a piston-shaped acoustic mode 30 of the piston mode transducer 22, having an amplitude which is essentially flat inside the aperture (e.g., the amplitude may be within 10% of a flat curve in the aperture) and which decreases in the slow edge region and in the fast gap. This may further reduce a coupling to spurious modes in the aperture. If the gap between the electrodes is wide enough, the acoustic wave amplitude in the bussbars may be negligible and the velocity in the bussbars may not significantly impact performance of the SAW resonator 10.

Figure 2B:
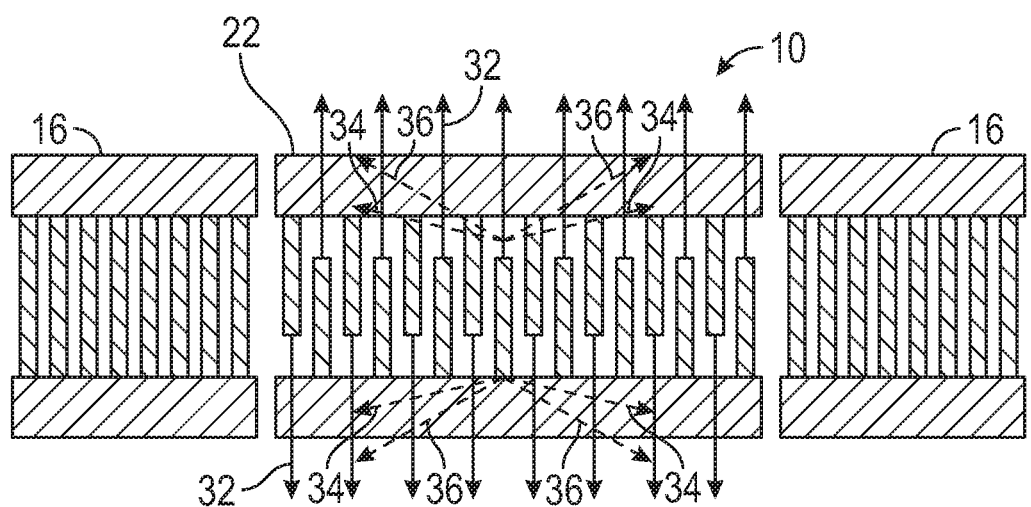
FIG. 2B is a schematic diagram of energy leakage in the SAW resonator of FIG. 1A incorporating the piston mode transducer of FIG. 2A.

FIG. 2B is a schematic diagram of energy leakage in the SAW resonator 10 of FIG. 1A incorporating the piston mode transducer 22 of FIG. 2A. A higher Q can be obtained for the SAW resonator 10 by having a polarization of the acoustic waves mostly along a desired direction of propagation (e.g., across the interdigital electrodes) and/or vertically. For example, on lithium niobate near to 128°, the piston mode transducer 22 can induce a quasi-Rayleigh mode in which the mechanical displacements are mostly in the sagittal plane (i.e., the plane formed by the propagation direction and the vertical axis) and displacements in the transverse direction (e.g., parallel to the interdigital electrodes) are very small. However, in some cases the excited mode of the piston mode transducer 22 is a shear horizontal mode, such as for lithium tantalate or lithium niobate with an orientation between Y−30° and Y+60°. In the shear horizontal mode, the direction of the acoustical displacements is mainly parallel to the electrodes and the piston mode transducer 22 suffers from a severe drawback.

When the displacement in the transverse direction is large, the edges of the interdigital electrodes (in the transverse directions) move in phase and generate acoustic waves 32 parallel to the interdigital electrodes, as shown in FIG. 2B. Oblique shear horizontal waves 34 and oblique Rayleigh waves 36 may also be generated. The phenomenon of generating the acoustic waves 32 parallel to the electrodes may be present in other cases, but it is larger in the case of a shear horizontal mode. In addition, the large gap of the piston mode transducer 22 can make the acoustic waves 32 stronger, resulting in lower Q. To reduce or avoid this acoustic radiation, embodiments described herein modify the transducer structure in the transverse direction to avoid having a significant acoustic energy close to the interdigital electrode end gap.

Figure 3A:
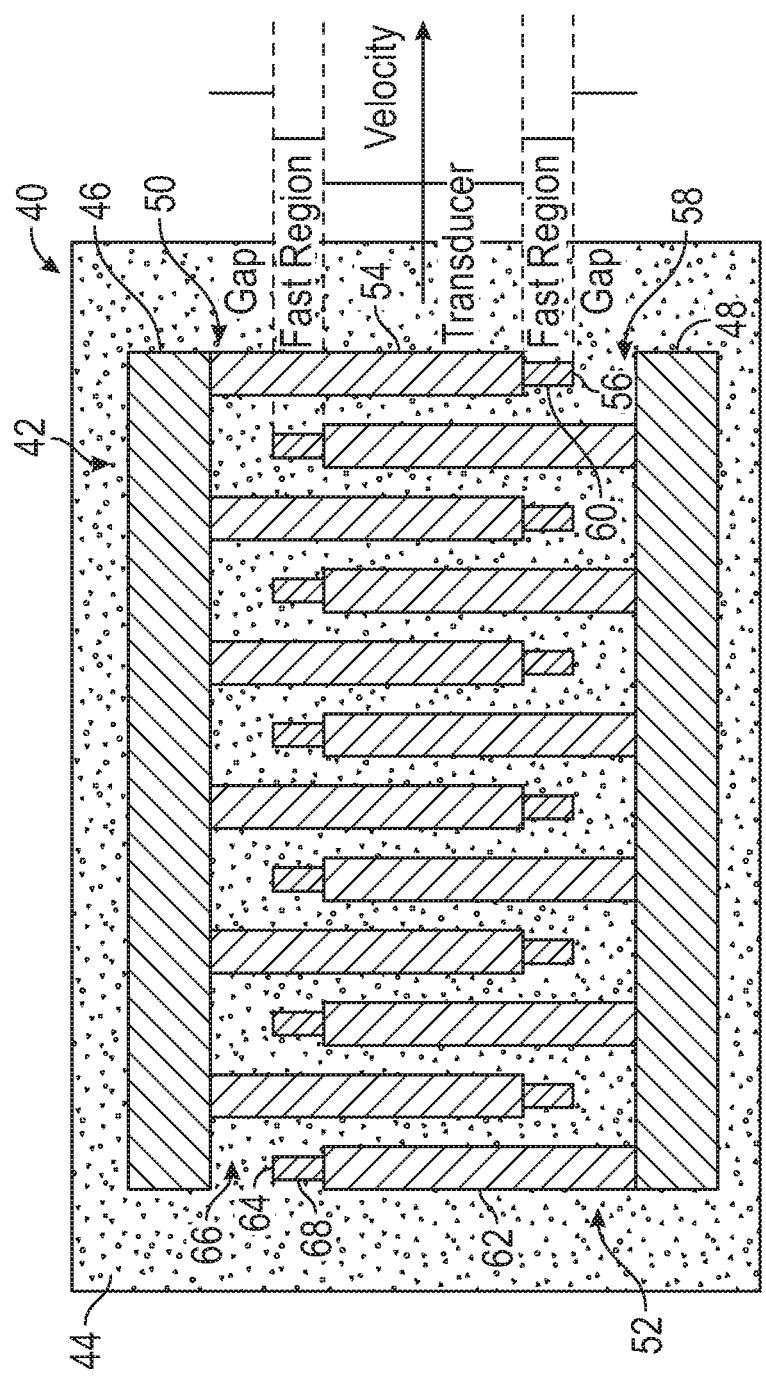
FIG. 3A is a schematic diagram of an exemplary SAW device according to aspects of the present disclosure, incorporating an interdigital transducer (IDT) with a modified transducer structure.

FIG. 3A is a schematic diagram of an exemplary SAW device 40 according to aspects of the present disclosure, incorporating an IDT 42 with a modified transducer structure. In this regard, the SAW device 40 may include or be incorporated in a SAW resonator 10 as described above with respect to FIG. 1A, an RF filter (e.g., the ladder type filter 18) as described above with respect to FIG. 1B, and/or a CRF 20 as described above with respect to FIG. 1C. In addition, the IDT 42 may form the transducer 12 of FIG. 1A.

In an exemplary aspect, the SAW device 40 includes a piezoelectric substrate 44 (e.g., incorporated in the piezoelectric substrate 14) and the IDT 42 disposed over the piezoelectric substrate 44. The IDT 42 includes a first electrode 46 and a second electrode 48, which may be parallel bussbars coupled to input and output signals respectively. A first set of electrode fingers 50 is coupled to the first electrode 46, and a second set of electrode fingers 52 is interleaved with the first set of electrode fingers 50 and coupled to the second electrode 48. At least one of the electrode fingers (e.g., from the first set of electrode fingers 50 and/or the second set of electrode fingers 52) is modified to reduce acoustic wave amplitude at a periphery of the electrode fingers 50, 52. This is done by changing the velocity in order to make the wave evanescent at an edge of the SAW device 40 (e.g., around ends of the electrode fingers 50, 52). This, in turn, reduces acoustic leakage of the SAW device 40.

In some cases, the piezoelectric substrate 44 of the SAW device 40 can be lithium tantalate (though this is not required, and other materials may be used, such as lithium niobate or other piezoelectric material(s)). In at least the case of lithium tantalate, the acoustical mode is a shear horizontal mode. The surface wave velocity can be larger than the velocity of the shear vertical bulk mode and a portion of the energy in the SAW device 40 is radiated in the volume of the piezoelectric substrate 44. The result for the surface wave is equivalent to propagation losses, and may be referred to as a "leaky SAW."

Two approaches may suppress these bulk radiation losses. The first approach replaces the piezoelectric substrate 44 of lithium tantalate with a thin layer of lithium tantalate bonded on a faster velocity substrate (e.g., silicon). This approach guides the energy inside the layer of lithium tantalate since the velocity in the supporting substrate is larger than the velocity of the surface wave. The second approach increases the metal thickness of the electrode fingers 50, 52 enough to reduce the surface wave velocity below the bulk wave velocities. This also results in the suppression of the bulk mode radiation. In such devices, it is found that transverse modes are difficult to suppress using a standard piston mode design. In addition, these approaches may add losses to the SAW device 40 and complicate the structure of the transverse mode.

Aspects of the present disclosure modify the structure of the SAW device 40 with a shear horizontal acoustic mode to suppress electroacoustic coupling to the Rayleigh mode. While acoustic coupling may still exist between the Rayleigh mode and the shear horizontal mode, the IDT 42 is designed to obtain a shear horizontal mode at a velocity which is lower than the Rayleigh mode velocity. In this manner, the Rayleigh mode cannot be excited at the frequency of the SAW device 40.

As shown in FIG. 3A, a fast region is added at an end of one or more electrode fingers of the IDT 42. For example, each of the first set of electrode fingers 50 includes a first inside region 54 and a first end 56 defining a first gap 58 with the second electrode 48. A first fast region 60 at the first end 56 defines a first propagation velocity at the surface of the piezoelectric substrate 44 which is faster than the first inside region 54. Similarly, each of the second set of electrode fingers 52 includes a second inside region 62 and a second end 64 defining a second gap 66 with the first electrode 46. A second fast region 68 at the second end 64 defines a second propagation velocity (which may be the same as the first propagation velocity) at the surface of the piezoelectric substrate 44 which is faster than the second inside region 62.

Each of the first fast region 60 and the second fast region 68 are large enough to avoid having a significant portion of the acoustic energy reach the first end 56 of the first set of electrode fingers 50 or the second end 64 of the second set of electrode fingers 52. In this manner, the shear mode may not be present at the first gap 58 or the second gap 66, and radiation of the Rayleigh mode parallel to the first set of electrode fingers 50 and the second set of electrode fingers 52 is suppressed (e.g., reduced or eliminated). The acoustic mode of the IDT 42 is thus guided between the first fast region 60 and the second fast region 68.

Figure 3B:
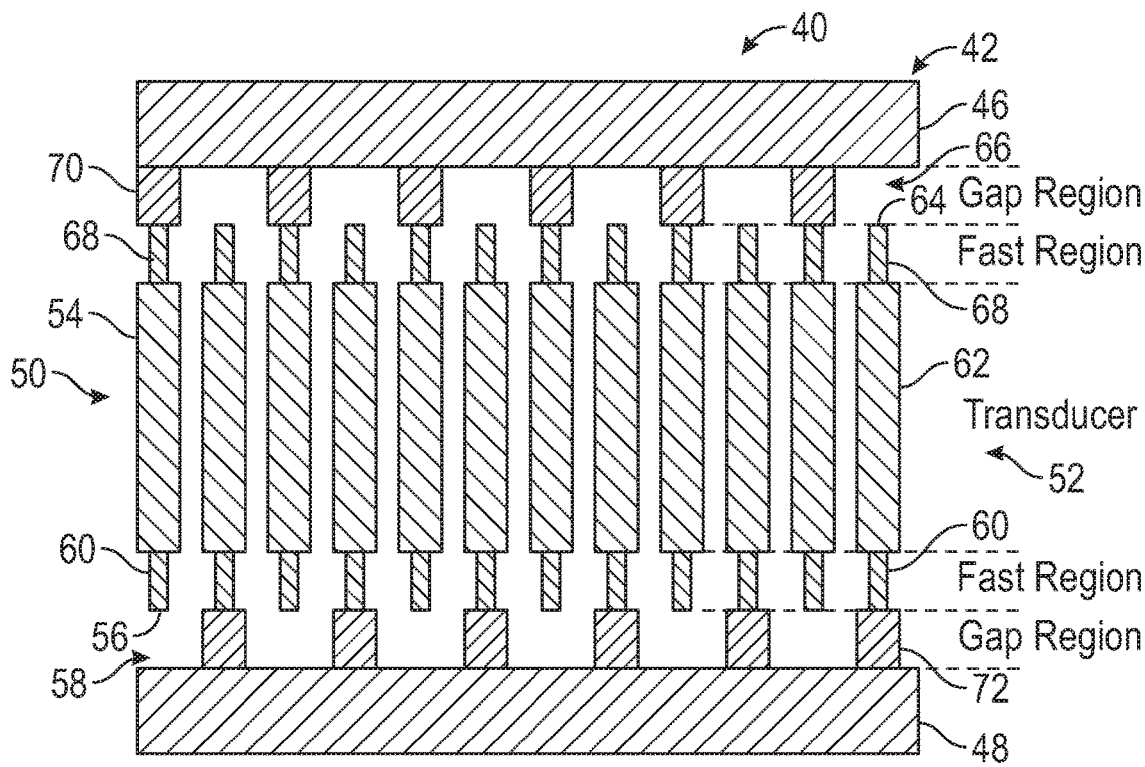
FIG. 3B is a schematic diagram of another exemplary SAW device, incorporating the IDT with an alternative modification of the transducer structure.

FIG. 3B is a schematic diagram of another exemplary SAW device 40, incorporating the IDT 42 with an alternative modification of the transducer structure. In FIG. 3A, the first end 56 of each of the first set of electrode fingers 50 is modified to include the first fast region 60, and the second end 64 of each of the second set of electrode fingers 52 is modified to include the second fast region 68. Alternatively, as illustrated in the exemplary SAW device 40 of FIG. 3B, it may be beneficial to modify a base region of both sets of electrode fingers 50, 52 such that the first fast region 60 and the second fast region 68 are defined through all the electrode fingers.

In this regard, each of the first set of electrode fingers 50 includes a first base region 70, and the first inside region 54 is between the first end 56 and the first base region 70. The first set of electrode fingers 50 also includes the first fast region 60 at the first end 56 and the second fast region 68 between the first base region 70 and the first inside region 54. In addition, each of the second set of electrode fingers 52 includes a second base region 72, and the second inside region 62 is between the second end 64 and the second base region 72. The second set of electrode fingers 52 also includes the second fast region 68 at the second end 64 and the first fast region 60 between the second base region 72 and the second inside region 62.

Thus, the first fast region 60 defines a first propagation velocity on the piezoelectric substrate 44 which is faster than the first inside region 54 and the second inside region 62. The second fast region 68 at the second end 64 defines a second propagation velocity (which may be the same as the first propagation velocity) on the piezoelectric substrate 44 which is faster than the first inside region 54 and the second inside region 62.

Figure 3C:
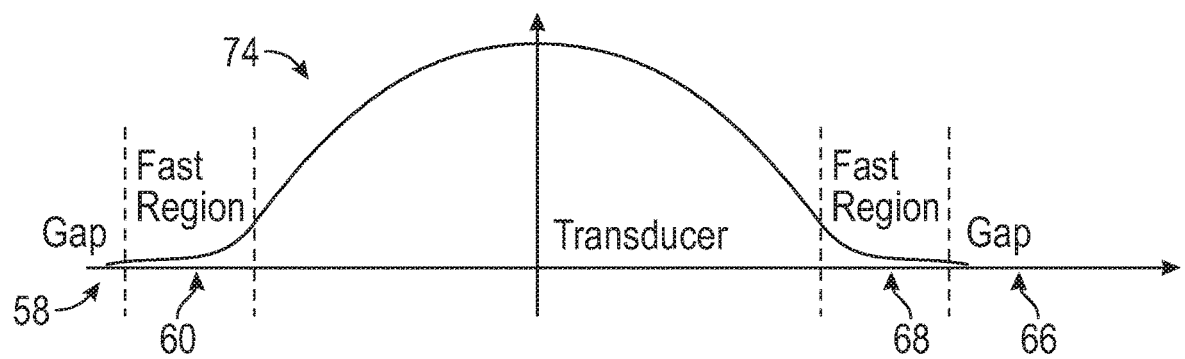
FIG. 3C is a graphical representation of the main acoustic mode of the exemplary SAW device of FIG. 3A or FIG. 3B in the transverse direction.

FIG. 3C is a graphical representation of a main acoustic mode 74 of the exemplary SAW device 40 of FIG. 3A or FIG. 3B in the transverse direction. As illustrated in FIG. 3C, the main acoustic mode 74 of the IDT 42 is guided between the first fast region 60 and the second fast region 68. The main acoustic mode 74 has a cosine shape in this active region and is evanescent in the first fast region 60 and the second fast region 68. At the first gap 58 and the second gap 66, the amplitude of the main acoustic mode 74 is at or near zero, suppressing generation of leaking Rayleigh modes and increasing the Q factor of the IDT 42. In this manner, each of the first set of electrode fingers 50 and the second set of electrode fingers 52 are physically modified to obtain a modified velocity (e.g., a faster velocity) in the first fast region 60 and the second fast region 68 compared to a center region between the first end 56 and the second end 64 such that a mode guided in the center region propagates. In some examples, the first inside region 54 of the first set of finger electrodes 50 and the second inside region 62 of the second set of finger electrodes 52 define the center region.

Figure 4A:
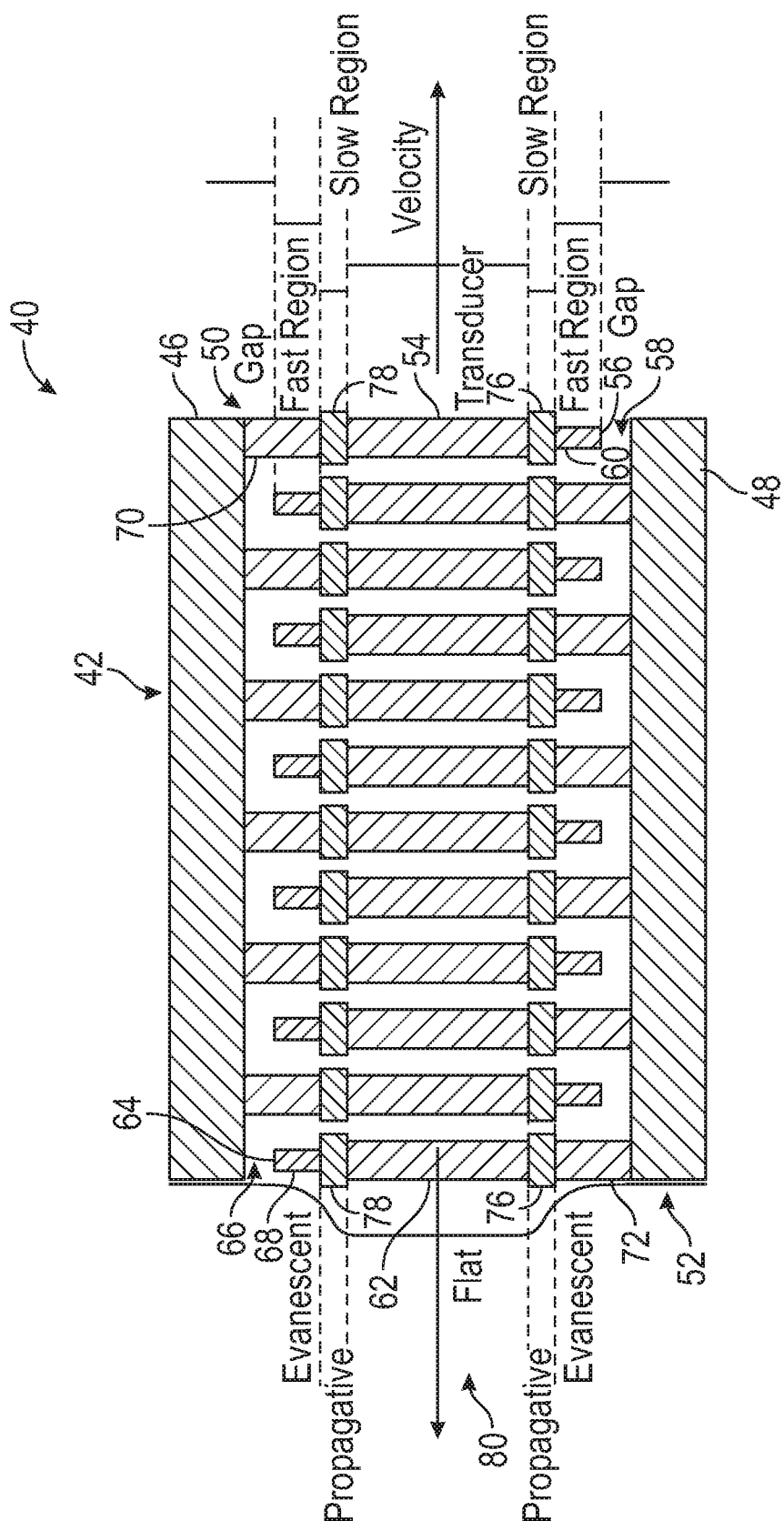
FIG. 4A is a schematic diagram of another exemplary SAW device, incorporating the modified transducer structure of FIG. 3A with a piston mode approach.

FIG. 4A is a schematic diagram of another exemplary SAW device 40, incorporating the modified transducer structure of FIG. 3A with a piston mode approach. The IDT 42 of FIG. 3A may experience transverse modes. To avoid this, the IDT 42 of FIG. 4A incorporates a piston mode approach by further including a slower region between the fast region 60, 68 of each electrode finger and the active region (e.g., the inside regions 54, 62). In this regard, each of the first set of electrode fingers 50 also includes a first slow region 76 between the first inside region 54 and the first fast region 60, having a propagation velocity lower than the first inside region 54. In some examples, each of the first set of electrode fingers 50 may also include a second slow region 78 between the first inside region 54 and the first base region 70. By including the first fast region 60, the IDT 42 can also have a smaller first gap 58 than the piston mode transducer 22 of FIG. 2A (e.g., less than or equal to an electrode width of the first inside region 54).

Similarly, each of the second set of electrode fingers 52 also includes the second slow region 78 between the second inside region 62 and the second fast region 68, having a propagation velocity lower than the second inside region 62. In some examples, each of the second set of electrode fingers 52 may include the first slow region 76 between the second inside region 62 and the second base region 72. Thus, similar to the piston mode transducer 22 of FIG. 2A, for the IDT 42 of FIG. 4A these velocities and a proper choice of width for the slow regions 76, 78 result in a piston-shaped acoustic mode 80 having a flat amplitude in the center region (e.g., defined by the first inside region 54 and the second inside region 62). In some examples, the amplitude of the acoustic mode 80 is within 10% of a flat curve in the center region. In addition, coupling of spurious modes may be reduced in the center region. The piston-shaped acoustic mode 80 is also evanescent in the first fast region 60 and the second fast region 68, and has a sinusoidal shape in the first slow region 76 and the second slow region 78.

The different velocities in each of the first set of electrode fingers 50 and the second set of electrode fingers 52 can be obtained through a number of techniques. For example, an electrode width of the first fast region 60 (and/or the second fast region 68), defined transverse to the first gap 58, can be smaller than an electrode width of the first inside region 54 (or the second inside region 62, respectively). Conversely, an electrode width of the first slow region 76 and the second slow region 78 can be larger than the electrode width of the first inside region 54 (or the second inside region 62, respectively). In other examples, instead of varying the width of the electrode fingers, the metal thickness can be different in each region. In this case, the first slow region 76 and the second slow region 78 have more metal than the first inside region 54 and the second inside region 62. The first fast region 60 and the second fast region 68 have less metal than the first inside region 54 and the second inside region 62. Other cases may vary the materials of the IDT 42, and multiple such velocity control approaches can be combined. Additional velocity control approaches are further described below with respect to FIGS. 5A-11.

Figure 4B:
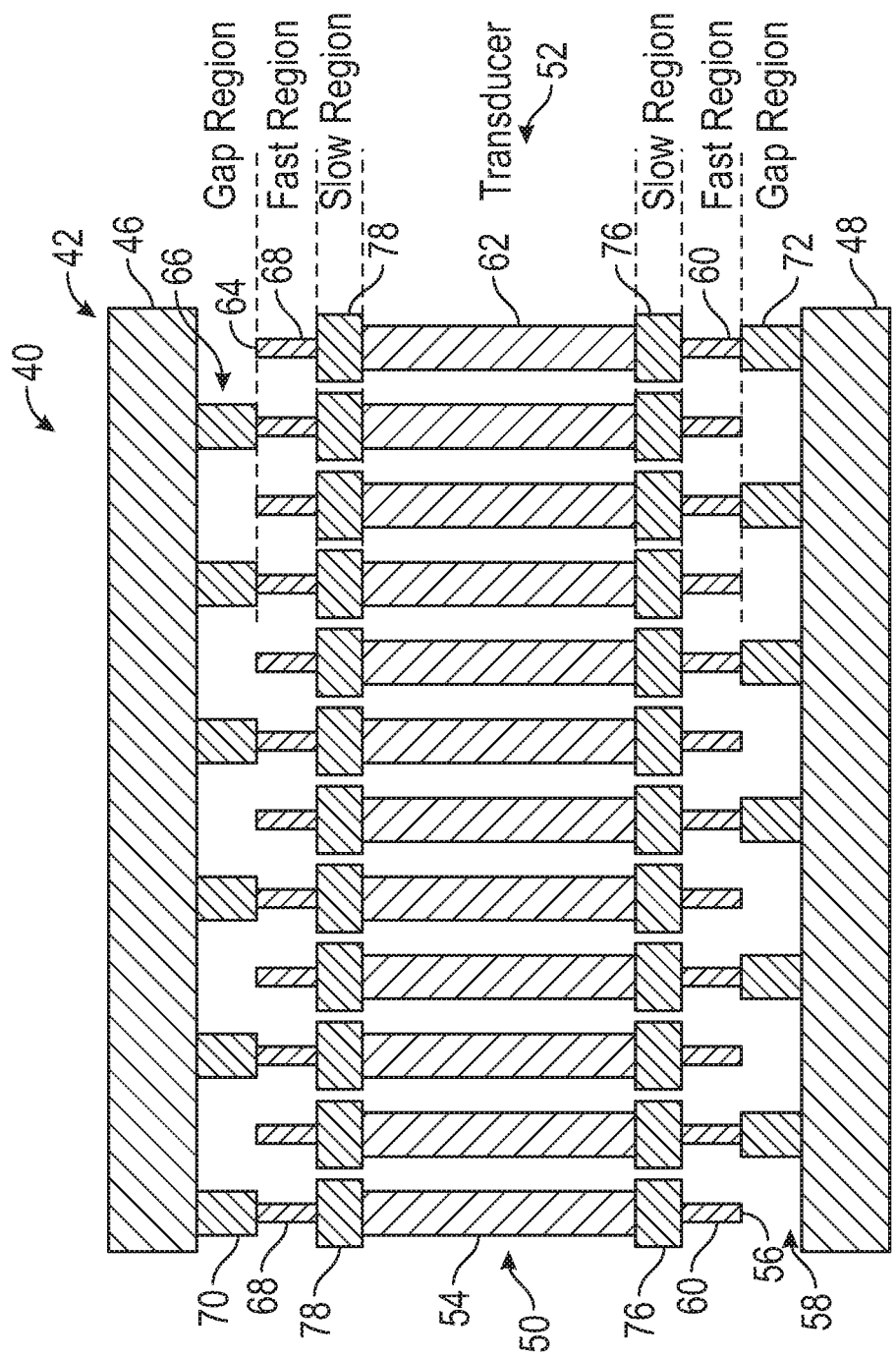
FIG. 4B is a schematic diagram of another exemplary SAW device, incorporating the modified transducer structure of FIG. 3B with a piston mode approach.

FIG. 4B is a schematic diagram of another exemplary SAW device 40, incorporating the modified transducer structure of FIG. 3B with a piston mode approach. In FIG. 4A, the first end 56 of each of the first set of electrode fingers 50 is modified to include the first fast region 60, and the second end 64 of each of the second set of electrode fingers 52 is modified to include the second fast region 68. Alternatively, as illustrated in the exemplary SAW device 40 of FIG. 4B, it may be beneficial to modify a base region of both sets of electrode fingers 50, 52 such that the first fast region 60 and the second fast region 68 are defined through all the electrode fingers.

In this regard, each of the first set of electrode fingers 50 includes the first fast region 60 at the first end 56 and the second fast region 68 between the first base region 70 and the first inside region 54. Each of the first set of electrode fingers 50 also includes the first slow region 76 between the first inside region 54 and the first fast region 60 and the second slow region 78 between the first inside region 54 and the second fast region 68.

In addition, each of the second set of electrode fingers 52 includes the second fast region 68 at the second end 64 and the first fast region 60 between the second base region 72 and the second inside region 62. Each of the second set of electrode fingers 52 also includes the second slow region 78 between the second inside region 62 and the second fast region 68 and the first slow region 76 between the second inside region 62 and the first fast region 60.

Figure 5A:
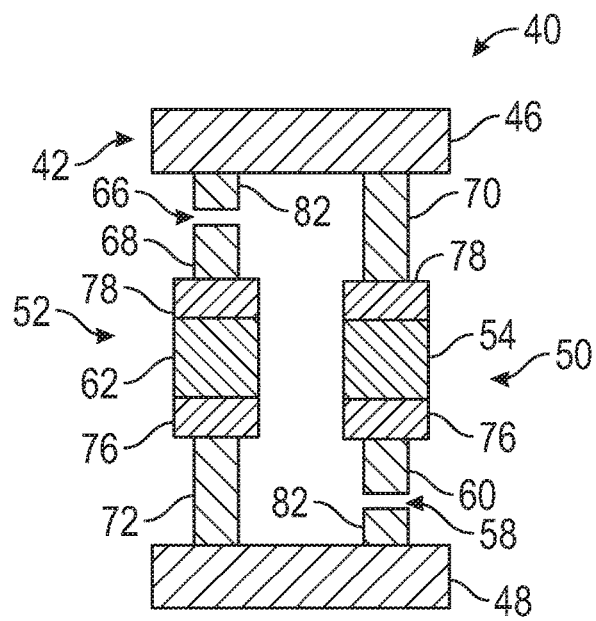
FIG. 5A is a schematic diagram of another exemplary SAW device, incorporating the modified transducer structure of FIG. 3A and the piston mode of FIG. 4A.

FIG. 5A is a schematic diagram of another exemplary SAW device 40, incorporating the modified transducer structure of FIG. 3A and the piston mode of FIG. 4A. The exemplary SAW device 40 of FIG. 5A includes an IDT 42, illustrated showing only a first electrode finger 50 coupled to the first electrode 46 and a second electrode finger 52 coupled to the second electrode 48, but generally includes additional interleaved electrode fingers. For example, a transducer can be realized by repeating these two electrode fingers 50, 52 several times, typically between 10 and 100. In an exemplary aspect, the IDT 42 is made on a lithium tantalate substrate with an orientation Y+13°. The IDT 42 is formed with platinum having a relative thickness to a desired wavelength of 10% and copper with a thickness relative to the desired wavelength of 5.4%. The wavelength is defined herein as twice a distance between centers of two consecutive electrode fingers 50, 52.

The first inside region 54, the second inside region 62, the first slow region 76, and the second slow region 78 have a 50% duty factor where the duty factor is the ratio of the electrode width to the period between electrodes. The first fast region 60, the second fast region 68, the first base region 70, and the second base region 72 have a 35% duty factor. A width of the first fast region 60 and the second fast region 68 in the transverse direction (e.g., parallel to the first gap 58) is 108% of the wavelength. Since the IDT 42 is optimized to reduce the acoustic energy close to the first gap 58 and the second gap 66, these gaps 58, 66 can be reduced. In the example depicted in FIG. 5A, a dummy electrode 82 can be included opposite the respective gap 58, 66, though this is not required. The velocity in the first slow region 76 and the second slow region 78 can be reduced by adding an additional layer of metal (e.g., copper). In this case, the thickness of the additional layer is 1.9% of the wavelength.

The slow region width in the transverse direction is 75% of the wavelength. Both the width of the slow region 76, 78 and its additional thicknesses are chosen to reduce the response of the transverse modes as much as possible. This optimum is normally obtained when a mode flat in the aperture (e.g., piston mode) propagates in the SAW device 40.

Figure 5B:
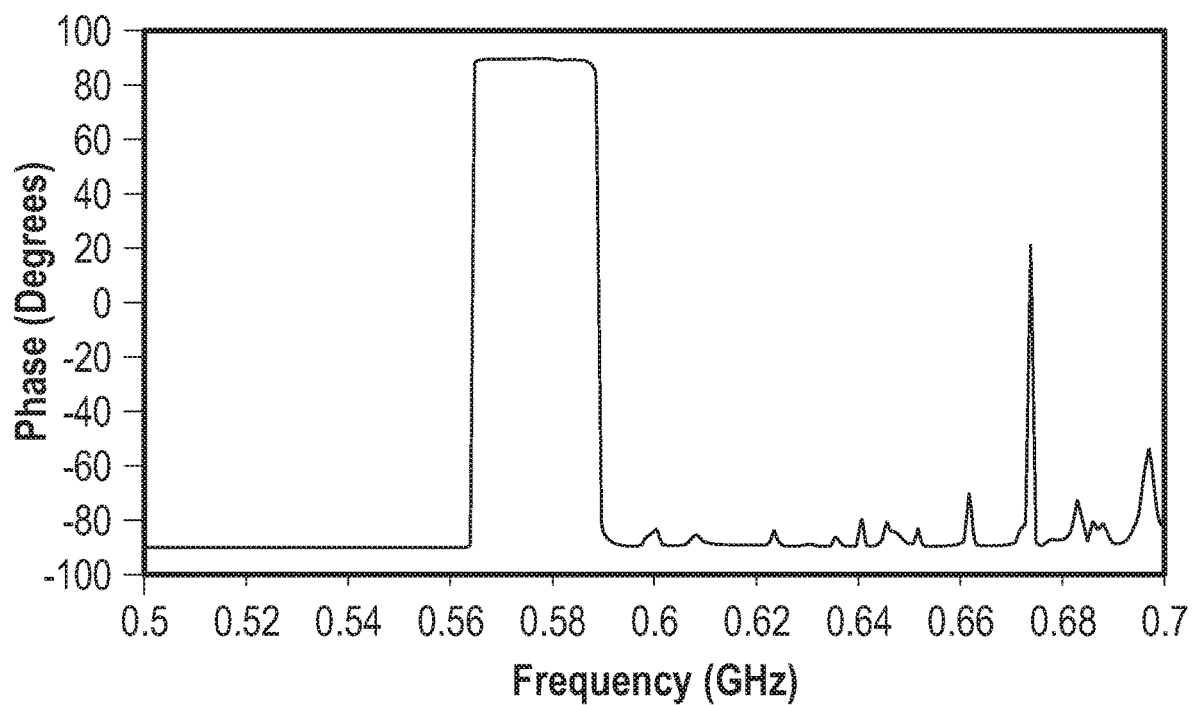
FIG. 5B is a graphical representation of an impedance phase of the exemplary SAW device of FIG. 5A.

FIG. 5B is a graphical representation of an impedance phase of the exemplary SAW device 40 of FIG. 5A. In this regard, the SAW device 40 has an impedance phase of 90 degrees around the desired frequency of 0.58 gigahertz (GHz) (e.g., between the resonance frequency of about 0.565 GHz and the antiresonance frequency of about 0.59 GHz) and almost no spurious modes.

Figure 6:
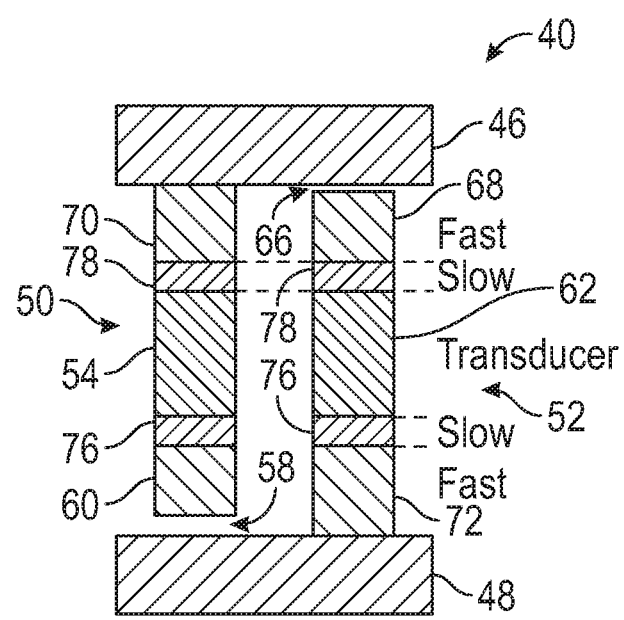
FIG. 6 is a schematic diagram of another exemplary SAW device incorporating the modified transducer structure of FIG. 3B and the piston mode of FIG. 4B.

FIG. 6 is a schematic diagram of another exemplary SAW device 40, incorporating the modified transducer structure of FIG. 3B and the piston mode of FIG. 4B. The SAW device 40 of FIG. 6 obtains the velocity differences described above by adapting the materials (e.g., metals) used in the different regions. For example, the first inside region 54 and the second inside region 62 (and in some cases the first base region 70 and second base region 72) can have a platinum thickness of 10% of the desired wavelength and a copper thickness of 5.4% of the desired wavelength. In the first slow region 76 and the second slow region 78, the copper thickness is increased to about 7.9% of the desired wavelength. In the first fast region 60 and the second fast region 68, the copper thickness is reduced to 3.5% of the desired wavelength. Alternatively, the platinum thickness can be varied in all or some of the regions. In the case of the electrode fingers 50, 52 being embedded in a dielectric (e.g., silicon oxide), the first slow region 76 and the second slow region 78 can be made by adding a strip of metal or dielectric and the fast region by changing the dielectric thickness or adding a layer of silicon nitride or aluminum nitride.

As with FIG. 5A, the SAW device 40 of FIG. 6 is shown with only the first finger electrode 50 and the second finger electrode 52, but these are generally repeated several times (e.g., 10 to 100 times). In addition, repeated periods (e.g., pairs of the first finger electrode 50 and the second finger electrode 52) can be modified versions of the base period to facilitate improved filter design. For example, the period can vary or the finger electrodes 50, 52 can be connected to different electrical ports (for example in CRFs as in FIG. 1C), while maintaining the velocity profile described above. Example layouts of different velocity control approaches are further described below with respect to FIGS. 7A-10B.

Figures 7A, 7B:
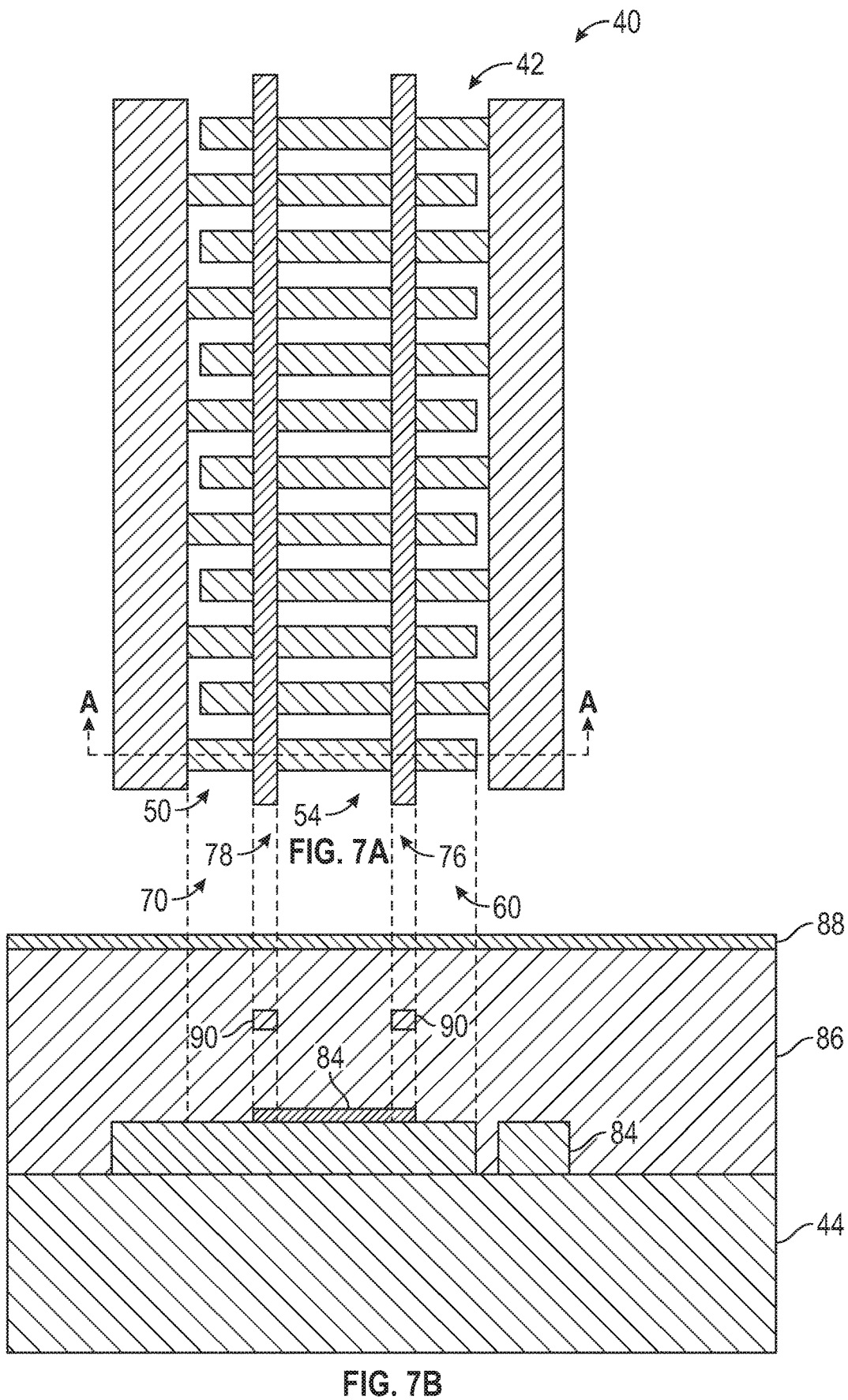
FIG. 7A is a top view of an exemplary SAW device implementing the IDT of FIGS. 3A-6.
FIG. 7B is a cross-section view taken along line A of FIG. 7A.

FIG. 7A is a top view of an exemplary SAW device 40 implementing the IDT 42 of FIGS. 3A-6. FIG. 7B is a cross-section view taken along line A of FIG. 7A. In this regard, electrodes 84 of the IDT 42 are deposited onto the piezoelectric substrate 44 and embedded in a dielectric layer 86 (e.g., silicon oxide or another appropriate dielectric). A passivation layer 88 can be disposed over the dielectric layer 86, though this is not required. The passivation layer 88 can include, for example, at least one of silicon nitride, aluminum nitride, aluminum oxide, or diamond.

For each of the first set of electrode fingers 50, the first slow region 76 and the second slow region 78 are obtained by embedding a slow material 90 (e.g., a metallic layer or other slow material) inside the dielectric layer 86. In other examples, the slow material 90 can be placed directly on top of the electrodes 84 (if the slow material 90 is not conductive), on top of the dielectric layer 86 or the passivation layer 88. In addition, the first fast region 60 is generated by reducing the metal thickness of the electrode 84. It should be understood that while FIGS. 7A and 7B are described with respect to the first set of electrode fingers 50, each of the second set of electrode fingers 52 can be similarly formed. This applies with respect to FIGS. 8A-10B as well.

Figures 8A, 8B:
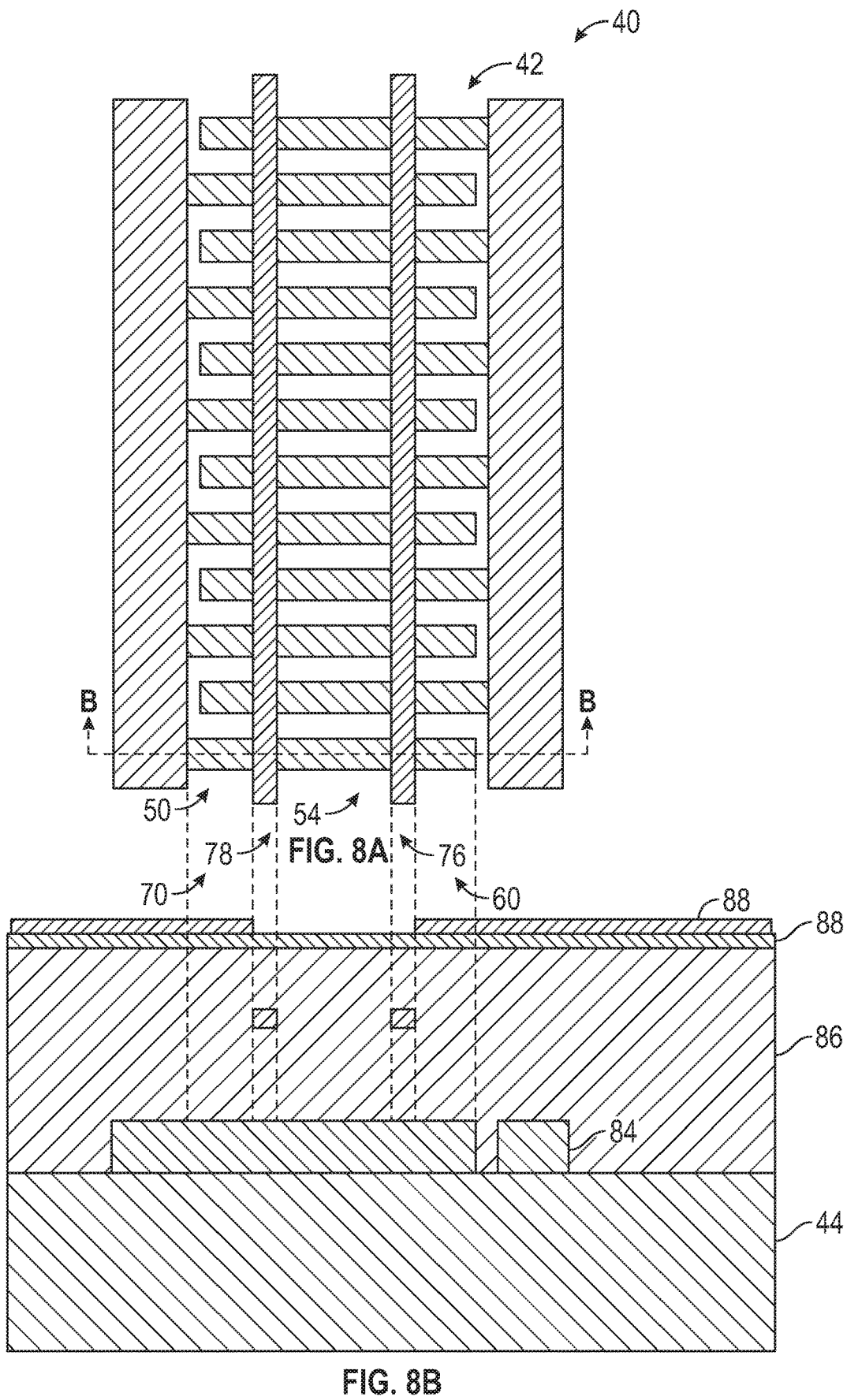
FIG. 8A is a top view of another exemplary SAW device implementing the IDT of FIGS. 3A-6.
FIG. 8B is a cross-section view taken along line B of FIG. 8A.

FIG. 8A is a top view of another exemplary SAW device 40 implementing the IDT 42 of FIGS. 3A-6. FIG. 8B is a cross-section view taken along line B of FIG. 8A. Similar to FIGS. 7A and 7B, the electrodes 84 of the IDT 42 are deposited onto the piezoelectric substrate 44 and embedded in the dielectric layer 86. For each of the first set of electrode fingers 50, the first fast region 60 is instead obtained by adding a fast material over the dielectric layer 86. For example, a thickness of the passivation layer 88 may be increased over the first fast region 60 compared with the first inside region 54, the first slow region 76, and the second slow region 78 (e.g., by depositing additional silicon nitride over the first fast region 60 and/or partially etching the passivation layer 88 in the first inside region 54).

Figure 9B:
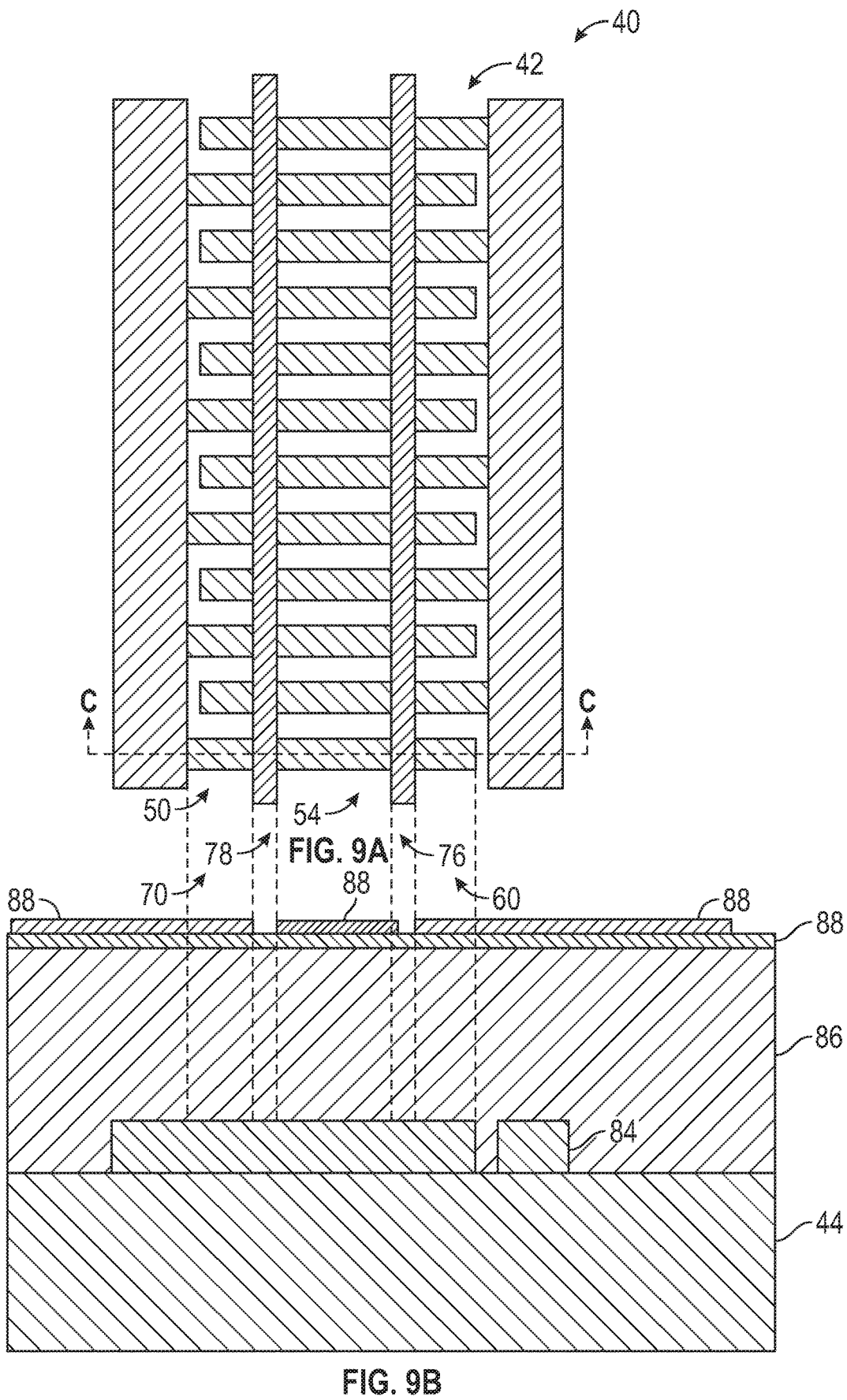
FIG. 9B is a cross-section view taken along line C of FIG. 9A.

FIG. 9A is a top view of another exemplary SAW device 40 implementing the IDT 42 of FIGS. 3A-6. FIG. 9B is a cross-section view taken along line C of FIG. 9A. Similar to FIGS. 7A-8B, the electrodes 84 of the IDT 42 are deposited onto the piezoelectric substrate 44 and embedded in the dielectric layer 86. For each of the first set of electrode fingers 50, the velocities of the various regions are obtained by modulating the amount of fast material over the dielectric layer 86. For example, the passivation layer 88 has a first thickness over the first slow region 76 and the second slow region 78 and a second thickness greater than the first thickness over the first inside region 54. The passivation layer 88 has a third thickness greater than the first or second thickness over the first fast region 60. As the passivation layer 88 grows thicker, the velocity increases.

A potential drawback for the SAW devices 40 described with respect to FIGS. 7A-9B can be a loss of coupling factor. The main acoustical mode of the IDT 42 is evanescent in the first fast region 60 and the second fast region 68. Since the fast regions 60, 68 are part of the IDT 42, they have a capacitance but are not useful to generate acoustic energy. This loss of coupling factor can be addressed by reducing the capacitance in the fast regions 60, 68 by inserting a dielectric layer between the electrodes 84 and the piezoelectric substrate 44 in these regions. Another potential drawback is that a spurious mode can be excited in the first end 56 and second end 64 (see FIGS. 3A and 4A). By adding a dielectric layer between the electrode 84 and the piezoelectric substrate 44 in the fast regions 60, 68, the electroacoustic coupling is drastically reduced in the fast edge region. An example is shown in FIGS. 10A and 10B.

FIG. 10A is a top view of another exemplary SAW device 40 implementing the IDT 42 of FIGS. 3A-6. FIG. 10B is a cross-section view taken along line D of FIG. 10A. Unlike FIGS. 7A-9B, the electrodes 84 of the IDT 42 are not embedded in the dielectric layer 86. However, a dielectric layer 92 is inserted between the electrode 84 and the piezoelectric substrate 44 in the first fast region 60 (and/or the first base region 70). The first slow region 76 and the second slow region 78 are formed by adding some material to the electrodes 84. In the case of FIGS. 10A and 10B, the dielectric layer 92 is a fast material and makes the first fast region 60. If a different dielectric material is used, the velocity in the first fast region 60 can be modulated by changing (e.g., reducing) the metal thickness of the electrode 84 or the electrode 84 width. While FIGS. 10A and 10B are illustrated with respect to an IDT 42 not embedded in the dielectric layer 86 of FIGS. 7A-9B, in other examples the dielectric layer 86 may be included. In this case, the first slow region 76 and the second slow region 78 can instead be generated as described in FIGS. 7A-9B, such as by using the slow material 90 in the dielectric layer 86 or on top of the dielectric layer 86, or by modulating a fast material on top of the dielectric layer 86.

FIG. 11 is a perspective view of an exemplary SAW device 40 according to aspects of the present disclosure. The SAW device 40 may be formed in a manner such as described above with respect to FIGS. 3A-10B. In an exemplary aspect, the piezoelectric substrate 44 is lithium tantalate with orientation of Y+10°. The electrode period is 2 microns (μm). The electrodes 84 are formed of tungsten 94 with a thickness of 6000 angstroms (Å) and aluminum 96 with a thickness of 2000 Å. The electrodes 84 are not embedded in a dielectric layer.

This physical structure of the IDT 42 is modulated to reduce the coupling of the Rayleigh mode. Thus, the first fast region 60 is made by using a 2000 Å layer of aluminum nitride 98 between the electrodes 84 and the piezoelectric substrate 44. The first slow region 76 is made in this case by increasing the duty factor to 60%.

The IDT 42 of FIG. 11 can be used on a traditional piezoelectric substrate 44, but can also be used on a substrate made of a thin piezoelectric film bonded (or deposited) on top of a support substrate. Additional layers can be inserted between the piezoelectric film and the supporting substrate. In some cases, the electrodes 84 may be embedded inside a dielectric material (e.g., dielectric layer 86 of FIGS. 7A-9B).

FIGS. 12A and 12B are graphical representations of the admittance phase and Q factor of the exemplary SAW device 40 of FIG. 11. FIG. 12A illustrates an admittance phase 100, with better than 85° admittance phase at the desired frequency of 0.54 GHz (e.g., between 0.53 GHz and 0.5525 GHz). FIG. 12B illustrates a Bode plot 102 of the Q factor, with a Q factor of better than 4000 at the desired frequency of 0.54 GHz (e.g., between 0.5375 GHz and 0.541 GHz).

Those skilled in the art will recognize improvements and modifications to the preferred embodiments of the present disclosure. All such improvements and modifications are considered within the scope of the concepts disclosed herein and the claims that follow.

What is claimed is:

1. A surface acoustic wave (SAW) device, comprising:
   a piezoelectric substrate; and
   an interdigital transducer (IDT) disposed over the piezoelectric substrate, comprising:
      a first electrode;
      a second electrode;
      a first set of electrode fingers comprising a first metal and a second metal and coupled to the first electrode, each comprising:
         a first inside region;
         a first end defining a first gap with the second electrode;
         a first fast region adjacent the first end having a reduced thickness of the first metal relative to the first inside region to define a first propagation velocity on the piezoelectric substrate which is faster than the first inside region; and
         a first slow region between the first inside region and the first fast region having an increased thickness of the first metal relative to the first inside region to define a second propagation velocity through the piezoelectric substrate which is slower than the first inside region; and
      a second set of electrode fingers interleaved with the first set of electrode fingers and coupled to the second electrode, each comprising:
         a second inside region; and
         a second end defining a second gap with the first electrode.

2. The SAW device of claim 1, wherein acoustic waves are guided in the first inside region and the second inside region.

3. The SAW device of claim 1, wherein an electrode width of the first fast region, defined transverse to the first gap, is smaller than an electrode width of the first inside region.

4. The SAW device of claim 1, wherein a metal thickness of the first fast region over the piezoelectric substrate is smaller than a metal thickness of the first inside region.

5. The SAW device of claim 1, wherein a material of the first fast region differs from a material of the first inside region and produces the first propagation velocity.

6. The SAW device of claim 1, further comprising a dielectric layer over the piezoelectric substrate and the IDT.

7. The SAW device of claim 6, further comprising a passivation layer over the dielectric layer having a greater thickness over the first fast region.

8. The SAW device of claim 7, wherein the passivation layer comprises at least one material selected from the group of aluminum nitride, aluminum oxide, and diamond.

9. The SAW device of claim 1, wherein a width of the first fast region, defined parallel to the first gap, is at least one wavelength.

10. The SAW device of claim 1, wherein each of the second set of electrode fingers further comprises a second fast region adjacent the second end defining a third propagation velocity through the piezoelectric substrate which is faster than the second inside region.

11. The SAW device of claim 10, wherein the first set of electrode fingers and the second set of electrode fingers define a mode within 10% of a flat curve in the first inside region.

12. The SAW device of claim 11, wherein each of the second set of electrode fingers further comprises a second slow region between the second inside region and the second fast region which defines a fourth propagation velocity through the piezoelectric substrate which is slower than the second inside region.

13. The SAW device of claim 12, wherein an electrode width of the first slow region and the second slow region, defined transverse to the first gap and the second gap, is larger than an electrode width of the first inside region.

14. The SAW device of claim 12, wherein a thickness of the first slow region and the second slow region over the piezoelectric substrate is larger than a thickness of the first inside region.

15. The SAW device of claim 12, wherein a dielectric layer is deposited over the first slow region and the second slow region.

16. The SAW device of claim 12, further comprising a dielectric layer over the piezoelectric substrate and the IDT;
   wherein a metallic layer is embedded within the dielectric layer over the first slow region and the second slow region.

17. The SAW device of claim 1, further comprising a dielectric layer between the piezoelectric substrate and the first set of electrode fingers in the first fast region.

18. The SAW device of claim 17, wherein the dielectric layer is a fast layer comprising at least one of silicon nitride or aluminum nitride.

19. The SAW device of claim 1, wherein the piezoelectric substrate comprises at least one of lithium tantalate or lithium niobate.

20. The SAW device of claim 1, wherein a third propagation velocity in the first gap is faster than the first fast region.

21. A surface acoustic wave (SAW) device, comprising:
a piezoelectric substrate; and
an interdigital transducer (IDT) disposed over the piezoelectric substrate, comprising:
a first electrode;
a second electrode;
a first set of electrode fingers coupled to the first electrode and having a first gap from the second electrode at a first end; and
a second set of electrode fingers interleaved with the first set of electrode fingers and coupled to the second electrode, having a second gap from the first electrode at a second end;
wherein:
the first set of electrode fingers and the second set of electrode fingers comprise a first metal and a second metal;
a thickness of the first metal in the first end of the first set of electrode fingers and the second end of the second set of electrode fingers is reduced to obtain a fast region with a faster velocity compared to a center region between the first end and the second end; and
the thickness of the first metal in a slow region between the fast region and the center region is increased to have a slower velocity than the center region.

22. The SAW device of claim 21, wherein gap regions defined by the first gap and the second gap have a faster velocity than the first end and the second end.

23. The SAW device of claim 22, wherein the first end and the second end are physically modified to have a smaller width, defined transverse to the first gap and the second gap, than the center region.

24. The SAW device of claim 22, wherein the first end and the second end are physically modified to have a smaller thickness over the piezoelectric substrate than the center region.

25. The SAW device of claim 21, wherein the center region is further physically modified to reduce a coupling to spurious modes in the center region.

* * * * *